(12) United States Patent
Wang et al.

(10) Patent No.: US 11,774,079 B1
(45) Date of Patent: Oct. 3, 2023

(54) LIGHT BOARD STRUCTURE AND LIGHT FIXTURE HAVING THE SAME

(71) Applicants: HANGZHOU TUYA INFORMATION TECHNOLOGY CO., LTD., Zhejiang (CN); ZHEJIANG TUYA SMART ELECTRONICS CO., LTD., Zhejiang (CN)

(72) Inventors: Jianwei Wang, Hangzhou (CN); Wenya Gao, Hangzhou (CN); Yinhua Zhang, Hangzhou (CN); Yifeng Jin, Hangzhou (CN); Xiaodong Shou, Hangzhou (CN); Lihuan Chen, Hangzhou (CN)

(73) Assignees: HANGZHOU TUYA INFORMATION TECHNOLOGY CO., LTD., Zhejiang (CN); ZHEJIANG TUYA SMART ELECTRONICS CO., LTD., Zhejiang (CN)

( * ) Notice: Subject to any disclaimer, the term of this patent is extended or adjusted under 35 U.S.C. 154(b) by 0 days.

(21) Appl. No.: 18/003,558

(22) PCT Filed: Jun. 25, 2021

(86) PCT No.: PCT/CN2021/102503
§ 371 (c)(1),
(2) Date: Dec. 28, 2022

(87) PCT Pub. No.: WO2022/001891
PCT Pub. Date: Jan. 6, 2022

(30) Foreign Application Priority Data

Jun. 28, 2020 (CN) .......................... 202010596739.9
Sep. 4, 2020 (CN) .......................... 202010923789.3
Sep. 4, 2020 (CN) .......................... 202021922697.5

(51) Int. Cl.
*F21V 23/00* (2015.01)
*F21V 23/04* (2006.01)

(52) U.S. Cl.
CPC .......... *F21V 23/005* (2013.01); *F21V 23/002* (2013.01); *F21V 23/0435* (2013.01)

(58) Field of Classification Search
CPC .. F21V 23/005; F21V 23/002; F21V 23/0435; F21V 23/004; F21V 23/003;
(Continued)

(56) References Cited

U.S. PATENT DOCUMENTS

| 10,015,869 B2 * | 7/2018 | Chung .................... F21K 9/232 |
| 2007/0007898 A1 * | 1/2007 | Bruning ................. H05B 45/40 |
| | | 315/34 |

(Continued)

FOREIGN PATENT DOCUMENTS

| CN | 201025632 Y | 2/2008 |
| CN | 102014180 A | 4/2011 |

(Continued)

OTHER PUBLICATIONS

Office Action dated Dec. 3, 2021, in corresponding Chinese Application No. 202010596739.9, 14 pages.
(Continued)

*Primary Examiner* — Bao Q Truong
(74) *Attorney, Agent, or Firm* — Maier & Maier, PLLC (57) ABSTRACT

A light board structure includes a board body, a wireless transceiver module and a light-emitting member. The wireless transceiver module and the light-emitting member are both installed on the board body. The wireless transceiver module has a feeder wire and a ground wire. The board body has a collision avoidance area, which runs through the board body and disposed to avoid collision with the wireless transceiver module and the light-emitting member. The
(Continued)

feeder wire and the ground wire are positioned on a side of the collision avoidance area. The collision avoidance area is configured to emit a radio wave, and solve a problem that the communication distance of a light board structure is short. A light fixture having the light board structure includes an installation cavity. The collision avoidance area of the light board structure matches an inner wall of the installation cavity to form a collision avoidance channel.

14 Claims, 3 Drawing Sheets

(58) Field of Classification Search
CPC ......... F21V 23/00; F21V 23/04; H05B 47/00; H05B 47/10; H05B 47/175; H05B 47/19
See application file for complete search history.

(56) References Cited

U.S. PATENT DOCUMENTS

| | | |
|---|---|---|
| 2016/0205752 A1 | 7/2016 | Chung |
| 2020/0275541 A1* | 8/2020 | Sondericker, III ......................... F21V 23/0435 |

FOREIGN PATENT DOCUMENTS

| | | |
|---|---|---|
| CN | 102610910 A | 7/2012 |
| CN | 103094661 A | 5/2013 |
| CN | 103219580 A | 7/2013 |
| CN | 203761333 U | 8/2014 |
| CN | 104136834 A | 11/2014 |
| CN | 208253381 U | 12/2018 |
| CN | 209232951 U | 8/2019 |
| CN | 209726124 U | 12/2019 |
| CN | 111649246 A | 9/2020 |
| CN | 112032687 A | 12/2020 |
| CN | 213066041 U | 4/2021 |
| JP | 2018195994 A | 12/2018 |
| TW | 201441542 A | 11/2014 |

OTHER PUBLICATIONS

Office Action dated May 13, 2022, in corresponding Chinese Application No. 202010596739.9, 14 pages.
Office Action dated Oct. 18, 2022, in corresponding Chinese Application No. 202010596739.9, 17 pages.
Search Report dated Nov. 26, 2021, in corresponding Chinese Application No. 202010596739.9, 2 pages.
Supplementary Search Report dated May 9, 2022, in corresponding Chinese Application No. 202010596739.9, 2 pages.
International Search Report dated Jan. 13, 2022 in corresponding International Application No. PCT/CN2021/102503; 6 pages.
Written Opinion dated Sep. 23, 2021 in corresponding International Application No. PCT/CN2021/102503; 7 pages.

* cited by examiner

FIG. 6

LIGHT BOARD STRUCTURE AND LIGHT FIXTURE HAVING THE SAME

CROSS-REFERENCE TO RELATED APPLICATION(S)

This application is a 371 application of International Application No. PCT/CN2021/102503, filed on Jun. 25, 2021, which claims priorities to Chinese Patent Application No. 202010596739.9, filed on Jun. 28, 2020 and entitled "intelligent light", Chinese Patent Application No. 202010923789.3, filed on Sep. 4, 2020 and entitled "light board and smart light bulb", and Chinese Patent Application No. 202021922697.5, filed on Sep. 4, 2020 and entitled "light board and smart light bulb", the contents of all of which are herein incorporated by reference in their entireties.

TECHNICAL FIELD

The present application relates to the technical field of light fixtures, and in particular, relates to a light board structure and a light fixture having the same.

BACKGROUND

At present, with the wide application of radio frequency technologies in the field of smart home, radio frequency modules have begun to be assembled on a variety of household appliances to achieve various wireless communication interactions with antennas. Generally, the types of antennas used in the radio frequency modules assembled on smart light bulbs include a PCB on-board antenna, a spring antenna, a conductor antenna, a ceramic antenna, and other forms. The above-mentioned antenna forms all need to protrude out of a light board, and the higher the protrusion, the better the radiation performance of the antenna.

However, for a smart light bulb with the above structure, a shadow created by the high protrusion of the antenna will affect the lighting effect of the whole light, and a communication distance would be shorter when the protrusion is small.

SUMMARY

An object of the present application is mainly to provide a light board structure and a light fixture having the same, in order to solve the technical problem that, in the prior art, the communication distance of a light board structure art is short.

To achieve the above object, according to an aspect of the present application, a light board structure is provided. The light board structure includes: a board body, a wireless transceiver module and a light-emitting member, wherein the wireless transceiver module and the light-emitting member are installed on the board body, and the wireless transceiver module has a feeder wire and a ground wire; and wherein the board body is provided with a collision avoidance area running through the board body and being disposed to avoid collision with the wireless transceiver module and the light-emitting member, the feeder wire and the ground wire are positioned on a side of the collision avoidance area, and the collision avoidance area is configured to emit a radio wave.

Further, the collision avoidance area includes an open slot; and the feeder wire and the ground wire are both positioned at an end of the open slot, or the feeder wire and the ground wire are positioned at each side of the open slot, respectively.

Further, the collision avoidance area further includes: a collision avoidance notch positioned in an edge of the board body, wherein the collision avoidance notch is communicated with the open slot, and the open slot is positioned between the collision avoidance notch and the wireless transceiver module.

Further, the open slot is of a strip-shaped slot structure, and the collision avoidance notch is an arc-shaped notch.

Further, the board body is of a circular board structure; the wireless transceiver module is disposed in the middle of the circular board structure, the open slot radially extends along the circular board structure, the collision avoidance notch is arc-shaped, and the collision avoidance notch extends along a periphery of the circular board structure.

Further, the collision avoidance notch has a corresponding arc length of L1, and the circular board structure has a perimeter of L2, with L1≥¼ L2.

Further, a plurality of light-emitting members are provided; the plurality of light-emitting members are annularly disposed on the board body at an interval; and the collision avoidance notch is disposed around the plurality of light-emitting members.

Further, the light board structure further includes a π-shaped circuit structure installed on the board body; and/or the collision avoidance area has a width of b, with 1 mm≤b≤3 mm.

Further, the board body is provided with an installation opening communicated with the collision avoidance area; and the wireless transceiver module includes: a pin header structure installed within the installation opening, wherein the pin header structure includes a first pin header and a second pin header, the first pin header forms the feeder wire, and the second pin header forms the ground wire.

Further, a lower surface of the board body is covered with a first aluminum coating layer; the board body is provided with a first port, the first port is positioned at an end of the collision avoidance area and runs through the board body, and the feeder wire passes through the first port to be connected to the first aluminum coating layer.

Further, the board body is further provided with a second port, the second port is spaced apart from the first port, the second port is positioned at an end of the collision avoidance area and runs through the board body, and the ground wire passes through the second port to be connected to the first aluminum coating layer.

Further, the wireless transceiver module is welded above the board body; and/or the feeder wire is tightened at the first port by means of a gasket and a screw.

Further, a plurality of light-emitting members are provided, the plurality of light-emitting members are annularly arranged, the collision avoidance area is positioned within an inner annular ring defined by the plurality of light-emitting members, and the collision avoidance area is an arc-shaped collision avoidance slot; and/or, the collision avoidance area is of a strip-shaped structure, and the length of the collision avoidance area is a half of a wavelength of the radio wave of the wireless transceiver module.

Further, the light board structure is installed in the installation cavity; a second aluminum coating layer is installed on an inner wall of the installation cavity; and the inner wall of an installation cavity is connected to the board body, such that the first aluminum coating layer and the second aluminum coating layer are conducted.

Further, the first aluminum coating layer and/or the second aluminum coating layer have a resonant frequency of 2.4 GHz or 5 GHz.

According to another aspect of the present application, a light fixture is provided. The light fixture includes: an installation cover provided with an installation cavity; and a light board structure installed within the installation cavity, wherein the light board structure is the light board structure provided above, and the collision avoidance area of the light board structure and the inner wall of the installation cavity fit to form a collision avoidance channel.

According to the technical solutions of the present application, the board body is provided with the collision avoidance area, and the feeder wire and the ground wire are located on a side the collision avoidance area, such that the feeder wire and the ground wire can conveniently receive and transmit signals by means of the collision avoidance area, to consequently form a crevice antenna or a slot antenna on the light board. In operation, the wireless transceiver module can effectively radiate electromagnetic waves to outer space by means of the collision avoidance area, such that the communication distance of the light board is greatly increased. Therefore, with the technical solutions provided in the present application, the technical problem that, in the prior art, the communication distance of the light board structure is short can be solved.

BRIEF DESCRIPTION OF THE DRAWINGS

The accompanying drawings that form a part of the present application are used to provide further understanding of the present application, and the schematic embodiments and descriptions thereof in the present application are used to explain the present application, and are not intended to improperly limit the present application. In the accompanying drawings.

DETAILED DESCRIPTION OF THE EMBODIMENTS

It should be noted that the embodiments and the features therein in the present application can be combined with each other in the absence of conflicts. The present application will be explained in detail below with reference to the accompanying drawings and in conjunction with the embodiments.

Embodiment 1 of the present application provides a light board structure. The light board structure includes a board body 10, a wireless transceiver module 20 and a light-emitting member 30. The wireless transceiver module 20 and the light-emitting member 30 are both installed on the board body 10, and the wireless transceiver module 20 has a feeder wire 21 and a ground wire 22. The board body 10 is provided with a collision avoidance area 11, which runs through the board body 10 and is disposed to avoid collision with the wireless transceiver module 20 and the light-emitting member 30; the feeder wire 21 and the ground wire 22 are both positioned on a side of the collision avoidance area 11; and the collision avoidance area 11 is configured to emit a radio wave. It should be noted that the side of the collision avoidance area 11 herein refers to a position surrounding the periphery of the collision avoidance area 11, and the light-emitting element 30 herein may be a light bead or an LED light or other component capable of emitting light.

With the light board structure provided in this embodiment, the board body 10 is provided with the collision avoidance area 11, and the feeder wire 21 and the ground wire 22 are located on the side the collision avoidance area, such that the feeder wire 21 and the ground wire 22 can conveniently receive and transmit signals by means of the collision avoidance area 11, to consequently form a crevice antenna or a slot antenna on the light board. In operation, the wireless transceiver module 20 can effectively radiate electromagnetic waves to outer space by means of the collision avoidance area 11, such that the communication distance of the light board is greatly increased.

Specifically, the collision avoidance area 11 includes an open slot 111. The feeder wire 21 and the ground wire 22 may be both positioned at an end of the open slot 111; or the feeder wire 21 and the ground wire 22 may be positioned at each side of the open slot 111, respectively. With both the above two different structural configurations, the feeder wire 21 and the ground 22 can conveniently receive signals by means of the open slot 111, such that an effective radiation portion of the antenna can be formed to ensure the radiation efficiency of the antenna.

In this embodiment, the collision avoidance area 11 further includes a collision avoidance notch 112 positioned in an edge of the board body 10. The collision avoidance notch 112 is communicated with the open slot 111, and the open slot 111 is positioned between the collision avoidance notch 112 and the wireless transceiver module 20. In such a structural configuration, the length of the collision avoidance area 11 can be conveniently increased to improve the radiation efficiency of the antenna in an even better fashion; in addition, the provision of the collision avoidance notch 112 at the edge of the board body 10 also facilitates avoiding collision with other devices and routed wires on the board body 10.

Specifically, the open slot 111 in the above embodiment is of a strip-shaped slot structure, and the collision avoidance notch 112 is an arc-shaped notch. In such a structural configuration, the length of the collision avoidance area 11 can be conveniently increased in an even better fashion on the basis of better avoidance of the wireless transceiver module 20, the light-emitting element 30 and other structures on the board body 10, such that the performance of the antenna can be guaranteed better.

In this embodiment, the board body 10 is of a circular board structure; the wireless transceiver module 20 is disposed in the middle of the circular board structure; the open slot 111 radially extends along the circular board structure; the collision avoidance notch 112 is arc-shaped; and the collision avoidance notch 112 extends along a periphery of the circular board structure. In such a structural configuration, the arrangement position of the collision avoidance area 11 can be conveniently optimized to increase the length of the collision avoidance area 11 as much as possible, and also to facilitate processing and manufacturing. It should be noted that "the wireless transceiver module 20 is disposed in the middle of the circular board structure" is not limited to the case where the wireless transceiver module 20 is disposed at a position corresponding to a circle center of the circular board structure, and a position near the circle center may also be involved.

Specifically, in this embodiment, the collision avoidance notch 112 has a corresponding arc length of L1, and the circular board structure has a perimeter of L2, with L1 ⩾ ¼L2. In such a structural configuration, the structural layout of the board body 10 can be further optimized, and the performance of the antenna can also be improved as much as possible while the collision with the components on the board body 10 is avoided.

In this embodiment, a plurality of light-emitting members 30 may also be provided; the plurality of light-emitting members 30 are annularly disposed on the board body 10 at interval; and the collision avoidance notch 112 is disposed around the plurality of light-emitting members 30. In such a structural configuration, the structural layout of the components on the board body 10 and the layout of the collision avoidance area 11 on the board body 10 can be conveniently optimized, such that the reasonable layout of the light-emitting element 30 can be guaranteed, and the length of the collision avoidance area 11 can be increased as much as possible, thereby improving the performance of the antenna in an even better fashion.

Specifically, in a solution of this embodiment, the light board structure further includes a π-shaped circuit structure, which is installed on the board body 10. For a small light fixture, due to the limitation of the size of the board body 10, the resonance point (S11<−10 dB) of a crevice antenna is generally at 2.8-3 GHz, and a resonance is coupled at 2.5 GHz. By means of the adaptive π-shaped circuit structure, the resonance point can be shifted to the frequency band of 2.4-2.5 GHz, which facilitates the use in Wi-Fi, Bluetooth, ZigBee and other communication systems of an ISM frequency band.

In another solution of this embodiment, the collision avoidance area 11 has a width of b, with 1 mm⩽b⩽3 mm Specifically, when the value of b is too small, the radiation efficiency of the antenna will be affected; and when the value of b is too large, the structure of the board body 10 will be affected. By setting the value of b to the above range, both the structure of the board body 10 and the radiation efficiency of the antenna can be guaranteed. Preferably, b may be selected as 1.5 mm.

Preferably, in a further solution of this embodiment, the light board structure further includes a π-shaped circuit structure, which is installed on the board body 10; and the collision avoidance area 11 has a width of b, with 1 mm⩽b ⩽3 mm. In such a structural configuration, the structure in this solution can be simultaneously endowed with the advantages of the structures in the above two solutions.

In this embodiment, the board body 10 may be made of a metal material. Specifically, the board body 10 may be an aluminum board. A drive board structure is further installed on the board body 10. The drive board structure includes a radio frequency module. The collision avoidance area 11 is also disposed to avoid collision with the drive board structure and the radio frequency module, and by means of the collision avoidance area 11, the feeding to the radio frequency module can also be facilitated.

Figure 1:
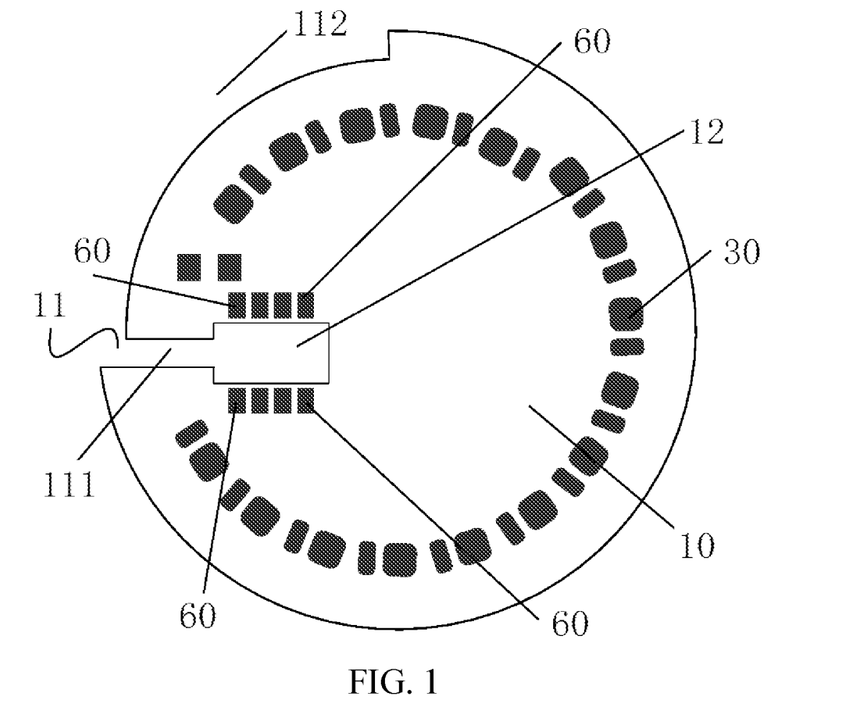
FIG. 1 shows a schematic structural diagram of a light board structure according to Embodiment 2 of the present application.
Figure 2:
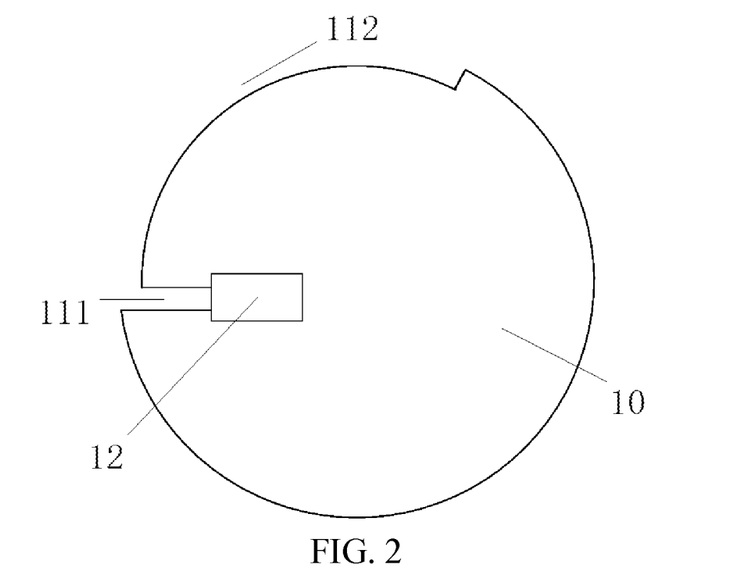
FIG. 2 shows a schematic structural diagram of a board body according to Embodiment 2 of the present application.

As shown in FIG. 1 and FIG. 2, Embodiment 2 of the present application provides a light board structure. The light board structure in this embodiment is an improved version based on the light board in Embodiment 1. In this embodiment, the board body 10 is provided with an installation opening 12 communicated with the collision avoidance area 11, and the wireless transceiver module 20 includes a pin header structure installed within the installation opening 12. The pin header structure includes a first pin header and a second pin header, the first pin header forms the feeder wire 21, and the second pin header forms the ground wire 22. Specifically, the first pin header may be disposed as a radio frequency interface, the second pin header may be disposed as a radio frequency reference structure, and the first pin header and the second pin header are positioned at the end of the collision avoidance area 11 to form a radiation portion of the antenna. In this way, the feeding to an antenna structure with a crevice can also be implemented by means of the first pin header and the second pin header. Compared with other forms of antennas that protrude out of the board body 10 in the prior art, the antenna structure in this embodiment does not protrude out of the board body 10 and thus does not block the light-emitting element 30 on the other side of the board body 10, such that a light source is prevented from being blocked by the antenna. In this embodiment, since it is unnecessary to dispose an antenna that runs through the board body 10 and protrudes out of the board body 10, a light tube is prevented from being blocked by the antenna, such that a smart light bulb has more uniform light distribution and high lighting quality. In addition, in this embodiment, since the self-contained pin header structure of the light board structure is used for the wireless transceiver module 20, it is also unnecessary to arrange an additional structure for forming the wireless transceiver module 20.

Preferably, in this embodiment, the installation opening 12 is positioned in the end of the collision avoidance area 11, and both the feeder wire 21 and the ground wire 22 are also positioned at the end of the collision avoidance area.

Specifically, in this embodiment, the light board structure is applicable to light fixtures of a variety of sizes, in particular various small light fixtures. For a small-size light fixture, generally, there is no space on the light board structure in the prior art for the provision of a slot for the protrusion of an antenna structure, and thus, antennas in the form of crossed radiation frequencies can only be used generally in the small-size light fixture in the prior art, which seriously affects the radio frequency performance during actual use.

However, for the light board structure in this embodiment, as long as the collision avoidance area 11 is disposed at a position where the collision with the pin header structure, the light-emitting elements 30 and other structures on the board body 10 is avoided, and the first pin header and the second pin header are positioned at the periphery of the collision avoidance area 11, the performance of the antenna can be improved, with a gain of 1-2 dBi and an efficiency up to about 30%, and an effective control distance in a complicated indoor communication environment can reach about 40 m, meeting the requirements of various usage scenarios of smart light fixtures. In addition, such an antenna in this embodiment has no other structure except the collision avoidance area 11 (which may be preferably a crevice, and the longer the length of the crevice, the better the performance of the antenna) provided on the board body 10, such that the production cost of products can be reduced to some extent.

In this embodiment, the pin header structure may include a plurality of pin headers. Specifically, the pin header structure includes eight pin headers, which are arranged in two rows and four columns. The first pin header and the second pin header are both positioned at the same column of the pin head structure. Eight corresponding welding points 60 are respectively provided on each side of the installation opening, with four welding points 60 positioned at one side of the installation opening 12, and the other four welding points positioned at the other side of the installation opening 12. The eight welding points 60 are disposed corresponding to the eight pin headers on a one-to-one basis. The first pin headers selected as the feeder wire and the second pin headers selected as the ground wire are positioned at the same column of the pin header structure; and the first pin headers and the welding points corresponding thereto are welded, and the second pin headers and the welding points corresponding thereto are welded.

Preferably, the first pin headers and the second pin headers may be selectively positioned at one end of the installation opening 12 away from the collision avoidance area 11, such that the first and second pin headers can radiate electromagnetic waves by means of both the collision avoidance area 11 and the installation opening 12, thereby improving the capacity of the antenna in an even better fashion.

Specifically, the collision avoidance area 11 in this embodiment includes an open slot 111, and the first pin header and the second pin header are positioned at an end of the open slot 111, respectively. In such a structure, an effective radiation portion of the antenna can be conveniently formed to ensure the radiation efficiency of the antenna.

Figure 3:
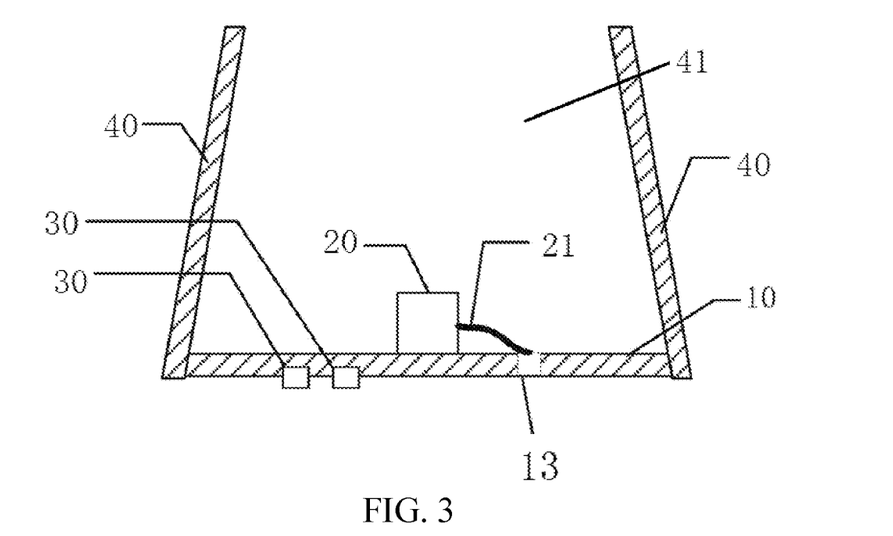
FIG. 3 shows a schematic structural diagram of a light fixture comprising a light board structure according to Embodiment 3 of the present application.

As shown in FIG. 3, Embodiment 3 of the present application provides a light board structure. The light board structure in this embodiment is an improved version based on Embodiment 1. In this embodiment, a lower surface of the board body 10 is covered with a first aluminum coating layer; the board body 10 is provided with a first port 13; the first port 13 is positioned at the end of the collision avoidance area 11 and runs through the board body 10; and the feeder wire 21 passes through the first port 13 to be connected to the first aluminum coating layer. In such a structural configuration, the feeder wire 21 can conveniently pass through the first port 13 to be in conduction with the first aluminum coating layer on the lower surface of the board body 10, such that the wireless transceiver module 20 takes the first aluminum coating layer as an antenna for receiving and transmitting radio waves.

Figure 4:
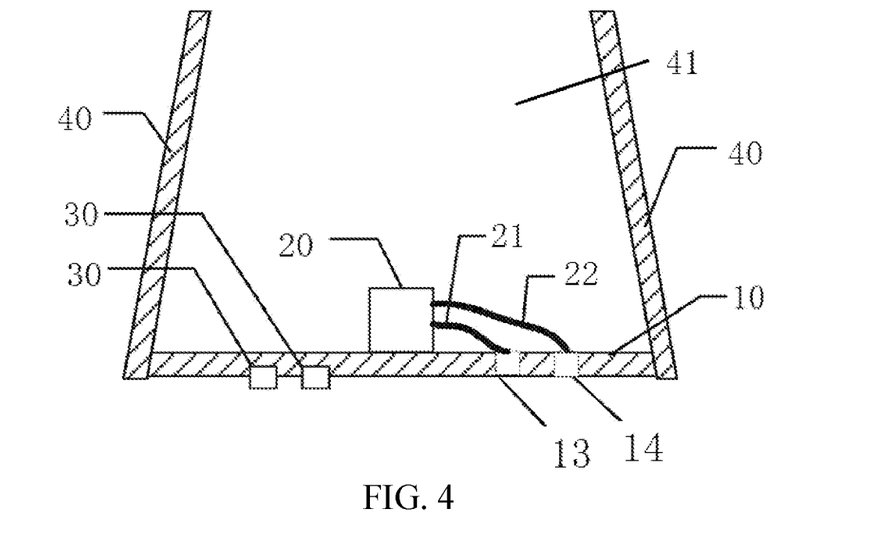
FIG. 4 shows a schematic structural diagram of a light fixture comprising a light board structure according to Embodiment 4 of the present application.
Figure 6:
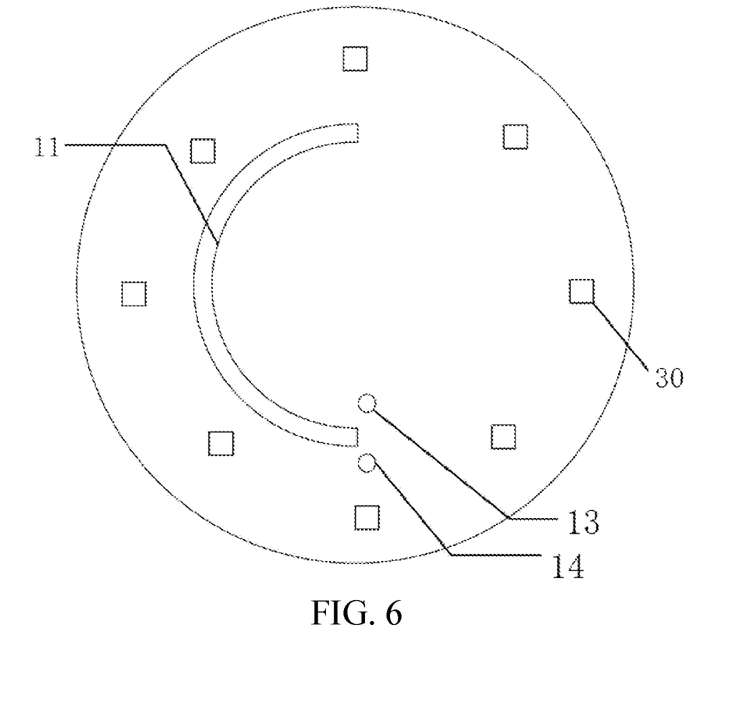
FIG. 6 shows a schematic structural diagram of a board body of the light board structure according to Embodiment 4 of the present application.

As shown in FIG. 4 and FIG. 6, Embodiment 4 of the present application provides a light board structure. The light board structure in this embodiment is an improved version based on construction of the light board structure in Embodiment 3. Specifically, in this embodiment, the board body 10 is further provided with a second port 14; the second port 14 is spaced apart from the first port 13; the second port 14 is positioned at the end of the collision avoidance area 11 and runs through the board body 10; and the ground wire 22 passes through the second port 14 to be connected to the first aluminum coating layer. In such a structural configuration, the conduction between the ground wire 22 and the first aluminum coating layer on the lower surface of the board body 10 can be facilitated, and here, the board body 10 having the aluminum coating layer can be equivalent to a PIFA antenna, such that a better performance is achieved for the antenna.

In the above Embodiments 3 and 4, the wireless transceiver module 20 may be welded above the board body 10; or, the feeder wire 21 may be tightened at the first port 13 by means of a gasket and a screw; or, the wireless transceiver module 20 may be welded above the board body 10, and the feeder wire 21 may be tightened at the first port 13 by means of the gasket and the screw.

Preferably, the wireless transceiver module 20 is welded above the board body 10, and the feeder wire 21 is tightened at the first port 13 by means of the gasket and the screw, such that the structural layout is improved and optimized to increase the connection and arrangement stability of the feeder wire 21. Preferably, the ground wire 22 may also be tightened at the first port 13 by means of a gasket and a screw, in order to increase the connection and arrangement stability of the feeder wire 22.

In Embodiments 3 and 4, a plurality of light-emitting members 30 may be provided, and the plurality of light-emitting members 30 are annularly arranged. The collision avoidance area 11 is positioned within an inner annular ring defined by the plurality of light-emitting members 30, and the collision avoidance area 11 is an arc-shaped collision avoidance slot. Or, in Embodiments 3 and 4, the collision avoidance area 11 is of a strip-shaped structure, and the length of the collision avoidance area 11 is half of a wavelength of the radio wave of the wireless transceiver module 20. Or, in Embodiments 3 and 4, a plurality of light-emitting members 30 are provided, and the plurality of light-emitting members 30 are annularly arranged; the collision avoidance area 11 is positioned within an inner annular ring defined by the plurality of light-emitting members 30, and the collision avoidance area 11 is an arc-shaped collision avoidance slot; and the collision avoidance area 11 is of a strip-shaped structure, and the length of the collision avoidance area 11 is half of a wavelength of the radio wave of the wireless transceiver module 20.

Specifically, a plurality of light-emitting members 30 are provided, the plurality of light-emitting members 30 are annularly arranged, the collision avoidance area 11 is positioned within an inner annular ring defined by the plurality of light-emitting members 30, and the collision avoidance area 11 is an arc-shaped collision avoidance slot, such that the collision avoidance area 11 is disposed close to the feeder wire 21 and the ground wire 22, whereby the feeder wire 21 and the ground wire 22 can conveniently receive and transmit signals by means of the collision avoidance area 11, thereby forming a crevice antenna or slot antenna on the light board structure. In this way, in operation, the wireless transceiver module 20 can more effectively radiate electromagnetic waves to outer space by means of the collision avoidance area 11, such that the communication distance of the light board structure is greatly increased.

The collision avoidance area 11 is of the strip-shaped structure, and the length of the collision avoidance area 11 is half of the wavelength of the radio wave of the wireless transceiver module 20, such that the electromagnetic waves can be more effectively radiated to the outer space by means of the collision avoidance area 11, and the communication distance of the wireless transceiver module 20 can be more significantly increased.

Embodiment 5 of the present application provides a light board structure. The light board structure in this embodiment is an improved version based on Embodiments 3 and 4. Specifically, the light board structure is installed in the installation cavity 41; a second aluminum coating layer is installed on the inner wall of the installation cavity 41; and the inner wall of the installation cavity 41 is connected to the board body 10, such that the first aluminum coating layer and the second aluminum coating layer are conducted. In such a structural configuration, the heat dissipation of the board body 10 can be facilitated; and the installation cavity 41 and the board body 10, when conducted, jointly form a PIFA antenna, which significantly increases the equivalent area of the antenna and further improves the wireless gain.

In this embodiment, the resonant frequency of the first aluminum coating layer is 2.4 GHz or 5 GHz; or the resonant frequency of the second aluminum coating layer is 2.4 GHz or 5 GHz; or the resonant frequency of both the first aluminum coating layer and the second aluminum coating layer is 2.4 GHz or 5 GHz. Specifically, by providing the first aluminum coating layer and the second aluminum coating layer with the resonant frequency of 2.4 GHz or 5 GHz, resonance may take place effectively to achieve excellent performance.

In all the above embodiments, the board body 10 may be disposed as an aluminum board structure; a drive board structure is installed on the board body 10 and includes a radio frequency module; the radio frequency module and the light-emitting elements 30 are installed on the same side of the board body 10; and the collision avoidance area 11 is also disposed to avoid collision with the drive board.

Figure 5:
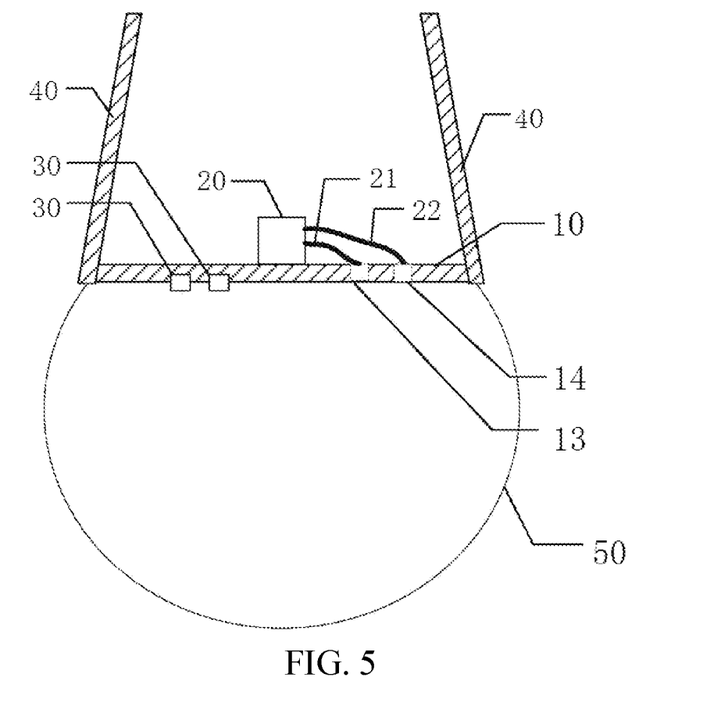
FIG. 5 shows a schematic structural diagram of a light fixture according to Embodiment 6 of the present application.

As shown in FIG. 5, Embodiment 6 of the present application provides a light fixture. The light fixture includes an installation cover 40 and a light board structure, and the installation cover 40 has an installation cavity 41. The light board structure is installed within the installation cavity 41, and is the light board structure provided as in all the above embodiments. The collision avoidance area 11 of the light board structure fits the inner wall of the installation cavity 41 to form a collision avoidance channel. In this embodiment, the installation cover 40 is also made of a metal material.

Specifically, when the collision avoidance area 11 includes the strip-shaped slot and the arc-shaped notch, the collision avoidance area 11 fits the inner wall of the installation slot to form an L-shaped collision avoidance channel. In this way, the length of the collision avoidance channel can be increased as much as possible on one hand, and on the other hand, the feeding is also facilitated by connecting the edge of the board body 10 to the middle of the board body 10.

In the field of smart home, smart lights occupy an important position, among which smart light bulbs have been widely used in smart furniture due to their low price, convenience and practicability.

Since the operating temperature of the light bulb is high, the light board (i.e., the foregoing board body) of the smart light bulb and the installation cavity 41 are both provided with an aluminum coating layer to facilitate the heat dissipation of the smart light bulb. These aluminum coating layers can stop the propagation of electromagnetic signals.

At present, the smart light bulbs on the market perform wireless communication by means of a wireless transceiver module (which is also the aforementioned wireless transceiver module 20) that is integrated inside a traditional light fixture. The wireless transceiver module is welded on the light board of the smart light bulb, and meanwhile, the light board is notched to allow an antenna to protrude out of the light board. When the antenna protrudes by a small length, the performance of the antenna is greatly reduced due to insufficient clearance around the antenna caused by the enclosure of the surrounding metallic aluminum coating layer, leading to poor signal quality and short communication distance, which seriously affects user's use experience.

If the length of the antenna is increased, the protruding antenna will block the light bead on the light board to affect the uniform light distribution of the smart light bulb; and under a condition with low light level, an obvious shadow will also be produced under the light due to the blockage of the antenna. Moreover, the smart light bulb per se has a limited volume and is also covered with the installation cover 40, such that the length of the antenna cannot be increased randomly.

For this purpose, in the present application, the light board of the smart light bulb is taken as an antenna, one or more light-emitting bodies are arranged below the light board, and the exterior of the installation cavity 41 is provided with a thread, such that the smart light bulb is fixed on a threaded opening in the ceiling. Specifically, in the present application, wireless signals are received and transmitted by means of the aluminum coating layer on the light board of the smart light bulb, and the surface of the light board is provided with the aluminum coating layer for heat dissipation, such that the light board has the effects of both wireless signal reception/transmission and heat dissipation.

Referring to FIG. 3, it exhibits a schematic structural diagram of a smart light bulb (which is also the aforementioned light fixture) according to the present application. The smart light bulb includes a light board, an installation cavity 41, a wireless transceiver module, and light-emitting bodies installed on the light board. The lower surface of the light board is provided with a first port 13 running through the light board; the first port 13 is approximately in the shape of a round hole; the lower surface of the light board is covered with an aluminum coating layer and is installed with the light-emitting bodies; and the aluminum coating layer on the surface of the light board can help the light-emitting bodies dissipate heat. A wireless transceiver module is disposed above the light board. A feeder wire 21 extending from the wireless transceiver module passes through the first port 13 to come into contact and conduction with the aluminum coating layer on the lower surface of the light board, and the feeder wire 21 is fixed on the second port 14 by means of a screw and a gasket, such that the wireless transceiver module receives and transmits radio waves by taking the light board, coated with the aluminum coating layer, as an antenna.

Referring to FIG. 4, in another embodiment of the present application, the light board further includes a second port 14 running through the light board. The ground wire 22 of wireless transceiver module passes through the second port 14 to be connected to the light board, and the ground wire 22 is fixed on the second port 14 by using a screw and a gasket, and thus is in conduction with the aluminum coating layer on the surface of the light board. At this time, the light board having the aluminum coating layer on the surface may be equivalent to a PIFA antenna, such that a better performance is achieved for the antenna.

It can be understood that the first port 13 and the second port 14 may partially run through the light board, the method for connecting the feeder wire 21 and the ground wire 22 to the light board in FIG. 3 and FIG. 4 may not be limited to the above screw fixation, and a person skilled in the art may conduct the feeder wire 21 and the ground wire 22 to the aluminum coating layer of the light board in any way, except that the feeder wire 21 and the ground wire 21 should not be too close to each other.

In the embodiments shown in FIG. 3 and FIG. 4, the surface of the installation cavity 41 may also be plated with the aluminum coating layer, such that the installation cavity 41 may also be in conduction with the light board to help the light board dissipate heat. Meanwhile, the installation cavity 41 and the light board, when conducted, jointly form a PIFA antenna, which significantly increases the equivalent area of the antenna and further improves the wireless gain.

Referring to FIG. 5, optionally, a light-permeable lampshade 50 is further installed below the light board of the smart light bulb. The lampshade 50 can adjust the distribution of light on one hand, and on the other hand, can prevent safety accidents caused by user's direct touch of components inside the smart light bulb. As an improvement to any embodiment in FIG. 3 to FIG. 5, referring to FIG. 6, it shows a bottom view of a light board. The light board of the smart light bulb may be provided with a crevice, which runs through the light board to form a crevice or slot antenna on the light board. The crevice may be in the shape of a curved or linear strip, and the length of the crevice is about half the wavelength of the operating frequency of a wireless communication module. In operation, the wireless communication module can effectively radiate electromagnetic waves to outer space by means of the crevice, such that the communication distance of the smart light bulb is greatly increased.

According to the smart light bulb of the present application, it has been verified that resonance may effectively take place at 2.4 GHz by taking the aluminum coating layer of the light board of the light bulb as an antenna, and the performance is excellent. In practical use, the shape of the light board and the thickness of the aluminum coating layer of the light board may be adjusted to adapt to different communication frequencies.

It can be understood that this solution is explained by taking the most common circular smart light bulb of 2.4 GHz as an example in the present application; it would have been readily conceivable to a person skilled in the art that the wireless communication module of the smart light bulb in the present application may be also based on Bluetooth, Zigbee, SubIG and other wireless communication technologies; and the size and shape of the light board and installation cavity 41 may be also in other forms, as long as the light board with the surface coated with aluminum can produce resonance at the operating frequency band of the wireless communication module and provide certain bandwidth. The number of light beads included in the smart light bulb may also be defined at one's discretion, and a combination of different numbers of LED light beads or other light-emitting bodies may be used, which have no effect on the implementation of this solution.

In the smart light bulb according to the present application, the antenna protruding downwards is no longer disposed via the light board, such that light is prevented from being blocked by the antenna, and the smart light bulb has more uniform light distribution and high lighting quality. In addition, the aluminum coating layer is used as the antenna for wireless communication in the present application, which reduces the shielding of signals by the installation cavity 41, and improves the quality of wireless communication signals for the smart light.

Referring FIG. 1, it shows a smart light bulb disclosed in an embodiment of the present application. The smart light bulb includes an installation cavity 41 and a light board accommodated in the installation cavity 41. The installation cavity 41 includes a metal layer. The light board includes a light board body, and a wireless transceiver module and a light-emitting body, which are installed on the light board body. The light board body is provided with an open slot extending from the edge of the light board, and a through hole next to both sides of the open slot. The wireless transceiver module is provided with a feeder wire 21 and a ground wire 22, which are connected to the through hole. In another preferred embodiment, the edge of the light board body is further provided with a notched slot, which is communicated with the open slot. The notched slot is defined by the light board and the installation cavity 41. That is, after being installed, the light board and the installation cavity 41 form a gap. In another preferred embodiment, the length of the notched slot is greater than or equal to a quarter of the perimeter of the light board body. In this embodiment, it has been tested that a remote control distance exceeds 50 m. In another preferred embodiment, the length of the notched slot is greater than or equal to one third of the perimeter of the light board body. It has been tested that the larger the length of the notched slot, the larger the remote control distance.

The light board is provided with an aluminum layer to facilitate heat dissipation. The light board is further provided with the light-emitting body and the wireless transceiver module. The feeder wire 21 and the ground wire 22, which extend from the wireless transceiver module, are communicated with the through hole, i.e., connecting the aluminum layer. In a preferred embodiment, the light board is provided with a plug pin connecting base (which may be the aforementioned pin header structure or other structures) close to the notched slot, and the plug pin connecting base is welded on the light board body. Two sockets, closest to the notched slot, of the pin connecting base are electrically connected to the through hole. The feeder wire 21 and the ground wire 22 may be plugged in the plug pin connecting base in a plug pin form, thereby realizing the connection with the through hole.

The inner surface of the installation cavity 41 may be provided with an aluminum layer to help the light-emitting body dissipate heat.

In another embodiment, a light-permeable lampshade 50 is further installed on the smart light bulb. The lampshade 50 can adjust the distribution of light on one hand, and on the other hand, can prevent safety accidents caused by user's direct touch of components inside the smart light bulb.

It can be understood that it is readily conceivable to a person skilled in the art that the wireless communication module of the smart light bulb in the present application may be based on Wi-FI, Bluetooth, Zigbee, SubIG and other wireless communication technologies; and the size and shape of the light board and installation cavity 41 may be also in other forms.

The smart light bulb according to the present application is no longer provided with an antenna protruding by passing through the light board, such that light is prevented from being blocked by the antenna, and the smart light bulb has more uniform light distribution and high lighting quality.

From the above description, it can be seen that the above embodiments of the present application achieve the following technical effects: a new form of antenna is developed, the protrusion of the antenna can be prevented simply by providing a long enough collision avoidance area on the board body, and the illumination effect is improved.

It should be noted that the terms used herein are only intended to describe specific embodiments rather than to limit the exemplary embodiments of the present application. As used herein, unless otherwise expressly indicated in the context, a singular form is intended to include a plural form as well. In addition, it should also be understood that the terms "include" and/or "comprise", when used in the specification, indicate existing features, steps, operations, devices, components, and/or combinations thereof.

Unless otherwise specifically explained, the relative arrangements, numerical expressions and numerical values of the components and steps recited in these embodiments do not limit the scope of the present application. Meanwhile, it should be understood that, for the convenience of description, the dimensions of each part shown in the accompanying drawings are not drawn according to the actual scaling relation. Techniques, methods and devices that are known to a person or ordinary skills in the related art may not be discussed in detail, but should be considered as part of the specification. In all examples shown and discussed herein, any specific value should be construed as illustrative only, rather than limiting. Therefore, other examples of the exemplary embodiments may have different values. It should be noted that like reference numerals and letters refer to like items in the accompanying drawings below. Therefore, once an item is defined in one drawing, it is unnecessary to further discuss this item in subsequent drawings.

In the description of the present application, it should be understood that the orientational terms such as "front", "back", "upper", "lower", "left", "right", "transverse", "vertical", "perpendicular", "horizontal", "top" and "bottom" indicate orientational or positional relations on the basis of the orientational or positional relations shown in the drawings, which are provided only for the convenience of describing the present application and simplifying the description. Unless otherwise stated on the contrary, these orientational terms do not indicate or imply that the apparatus or element referred to must have a specific orientation or must be constructed and operated in a specific orientation. Therefore, these cannot be understood as limiting the protection scope of the present application. The orientational terms "inside" and "outside" refer to inside and outside relative to the outline of each component itself.

For the convenience of description, spatially relative terms such as "on", "above", "on the upper surface of . . . " and "over" can be used herein to describe a spatial positional relation between a device or feature shown in the drawings and other devices or features. It should be understood that the spatially relative terms are intended to encompass different orientations of a device in use or operation in addition to its orientation depicted in the drawings. For example, if a device in the drawings is inverted, the device described as "on other devices or constructs" or "above other devices or constructs" would be positioned "under other devices or constructs" or "below other devices or constructs". Therefore, the exemplary term "above" may include two orientations, namely "above" and "below". This device may also be oriented in other ways (by 90-degree rotation or at other orientations), and the spatially relative description used herein are interpreted accordingly.

In addition, it should be noted that the terms such as "first" and "second" are used to define components only for the convenience of distinguishing the corresponding components. Unless otherwise stated, the above terms have no special meanings, and therefore, cannot be understood as limiting the protection scope of the present application.

Described above are merely preferred embodiments of the present application, which are not intended to limit the present application. Various modifications and variations can be made to the present application for those skilled in the art. Any modification, equivalent replacement, improvement and the like made within the spirit and principle of the present application shall be construed as being included in the protection scope of the present application.

What is claimed is:

1. A light board structure, comprising:
   a board body, a wireless transceiver module and a light-emitting member,
   wherein the wireless transceiver module and the light-emitting member are installed on the board body, and the wireless transceiver module has a feeder wire and a ground wire;
   wherein the board body is provided with a collision avoidance area running through the board body and being disposed to avoid collision with the wireless transceiver module and the light-emitting member, the feeder wire and the ground wire are positioned on a side of the collision avoidance area, and the collision avoidance area is configured to emit a radio wave;
   wherein a lower surface of the board body is covered with a first aluminum coating layer, the board body is provided with a first port, the first port is positioned at an end of the collision avoidance area and runs through the board body, and the feeder wire passes through the first port to be connected to the first aluminum coating layer.

2. The light board structure according to claim 1, wherein the collision avoidance area comprises an open slot, and wherein
   the feeder wire and the ground wire are positioned at an end of the open slot; or
   the feeder wire and the ground wire are positioned at two sides of the open slot, respectively.

3. The light board structure according to claim 2, wherein the collision avoidance area further comprises:
   a collision avoidance notch positioned in an edge of the board body, wherein the collision avoidance notch is communicated with the open slot, and the open slot is positioned between the collision avoidance notch and the wireless transceiver module.

4. The light board structure according to claim 3, wherein the open slot is of a strip-shaped slot structure, and the collision avoidance notch is an arc-shaped notch.

5. The light board structure according to claim 4, wherein the board body is of a circular board structure, the wireless transceiver module is disposed in a middle of the circular board structure, the open slot radially extends along the circular board structure, the collision avoidance notch is arc-shaped, and the collision avoidance notch extends along a periphery of the circular board structure.

6. The light board structure according to claim 5, wherein the collision avoidance notch has a corresponding arc length of L1, and the circular board structure has a perimeter of L2, with $L1 \geq \frac{1}{4} L2$.

7. The light board structure according to claim 3, wherein a plurality of the light-emitting members are disposed, the plurality of light-emitting members are annularly disposed on the board body at an interval, and the collision avoidance notch is disposed around the plurality of light-emitting members.

8. The light board structure according to claim 1, wherein the light board structure further comprises a π-shaped circuit structure installed on the board body; and/or
   the collision avoidance area has a width of b, with $1 \text{ mm} \leq b \leq 3 \text{ mm}$.

9. The light board structure according to claim 1, wherein the board body is provided with an installation opening communicated with the collision avoidance area, and the wireless transceiver module comprises:
   a pin header structure installed within the installation opening, wherein the pin header structure comprises a first pin header and a second pin header, the first pin header forms the feeder wire, and the second pin header forms the ground wire.

10. The light board structure according to claim 1, wherein the board body is further provided with a second port, the second port is spaced apart from the first port, the second port is positioned at an end of the collision avoidance area and runs through the board body, and the ground wire passes through the second port to be connected to the first aluminum coating layer.

11. The light board structure according to claim 1, wherein
   the wireless transceiver module is welded above the board body; and/or
   the feeder wire is tightened at the first port by means of a gasket and a screw.

12. The light board structure according to claim 1, wherein a plurality of the light-emitting members are provided, the plurality of light-emitting members are annularly arranged, the collision avoidance area is positioned within an inner annular ring defined by the plurality of light-emitting members, and the collision avoidance area is an arc-shaped collision avoidance slot; and/or
   the collision avoidance area is of a strip-shaped structure, and a length of the collision avoidance area is a half of a wavelength of the radio wave of the wireless transceiver module.

13. The light board structure according to claim 1, wherein the light board structure is installed in an installation cavity, a second aluminum coating layer is installed on an inner wall of the installation cavity, and the inner wall of the installation cavity is connected to the board body, such that the first aluminum coating layer and the second aluminum coating layer are conducted.

14. The light board structure according to claim 13, wherein the first aluminum coating layer and/or the second aluminum coating layer have a resonant frequency of 2.4 GHz or 5 GHz.

* * * * *